(12) United States Patent
Gu et al.

(10) Patent No.: US 10,867,995 B2
(45) Date of Patent: Dec. 15, 2020

(54) DEVICE INTEGRATED WITH DEPLETION-MODE JUNCTION FIELF-EFFECT TRANSISTOR AND METHOD FOR MANUFACTURING THE SAME

(71) Applicant: CSMC TECHNOLOGIES FAB2 CO., LTD., Jiangsu (CN)

(72) Inventors: Yan Gu, Jiangsu (CN); Shikang Cheng, Jiangsu (CN); Sen Zhang, Jiangsu (CN)

(73) Assignee: CSMC TECHNOLOGIES FAB2 CO., LTD., Wuxi New District (CN)

( * ) Notice: Subject to any disclaimer, the term of this patent is extended or adjusted under 35 U.S.C. 154(b) by 14 days.

(21) Appl. No.: 16/329,348

(22) PCT Filed: Aug. 21, 2017

(86) PCT No.: PCT/CN2017/098314
§ 371 (c)(1),
(2) Date: Feb. 28, 2019

(87) PCT Pub. No.: WO2018/040973
PCT Pub. Date: Mar. 8, 2018

(65) Prior Publication Data
US 2019/0221560 A1    Jul. 18, 2019

(30) Foreign Application Priority Data
Aug. 31, 2016   (CN) .......................... 2016 1 0793855

(51) Int. Cl.
*H01L 29/808* (2006.01)
*H01L 21/337* (2006.01)
(Continued)

(52) U.S. Cl.
CPC ........ *H01L 27/0705* (2013.01); *H01L 21/265* (2013.01); *H01L 21/823412* (2013.01);
(Continued)

(58) Field of Classification Search
CPC ... H01L 29/7802–7815; H01L 29/1095; H01L 29/7803–7808; H01L 29/10;
(Continued)

(56) References Cited

U.S. PATENT DOCUMENTS

| 5,923,065 A | 7/1999 | So et al. |
| 6,391,723 B1 | 5/2002 | Frisina |

(Continued)

FOREIGN PATENT DOCUMENTS

| CN | 102034820 A | 4/2011 |
| CN | 102386185 A | 3/2012 |

(Continued)

OTHER PUBLICATIONS

International Search Report dated Nov. 27, 2017 in the parent application PCT/CN2017/098314. 6 pages.

(Continued)

*Primary Examiner* — Eric A. Ward
(74) *Attorney, Agent, or Firm* — Polsinelli PC

(57) ABSTRACT

A device integrated with a depletion-mode junction field-effect transistor and a method for manufacturing the device. The device includes: a well region, which is of a second conduction type and formed within a first conduction region (214); a JFET source (210), which is of a first conduction type and formed within the well region; a metal electrode (212) of the JFET sources formed on the JFET sources (210), which is in contact with the JFET sources (210); a lateral channel region (208), which is of the first conduction type and formed between two adjacent JFET sources (210), while two ends thereof are in contact with the two adjacent JFET sources (210); and a JFET metal gate (213) formed on the well region.

15 Claims, 4 Drawing Sheets

(51) Int. Cl.
*H01L 27/07* (2006.01)
*H01L 29/10* (2006.01)
*H01L 21/265* (2006.01)
*H01L 29/66* (2006.01)
*H01L 21/8234* (2006.01)

(52) U.S. Cl.
CPC ............ *H01L 21/823425* (2013.01); *H01L 21/823487* (2013.01); *H01L 21/823493* (2013.01); *H01L 29/10* (2013.01); *H01L 29/66* (2013.01); *H01L 29/808* (2013.01)

(58) Field of Classification Search
CPC .......... H01L 29/1066; H01L 29/66909; H01L 29/8083; H01L 29/1058; H01L 29/66; H01L 29/66893; H01L 29/808; H01L 29/8086; H01L 27/0705; H01L 27/085; H01L 27/06; H01L 27/0617; H01L 21/265; H01L 21/823412; H01L 21/823425; H01L 21/823437; H01L 21/823487; H01L 21/823493; H01L 21/26513; H01L 21/8234
See application file for complete search history.

(56) References Cited

U.S. PATENT DOCUMENTS

| | | | |
|---|---|---|---|
| 7,211,845 B1 * | 5/2007 | Yu | H01L 29/1029 257/263 |
| 2003/0089930 A1 | 5/2003 | Zhao | |
| 2005/0285158 A1 * | 12/2005 | Tai | H01L 29/8083 257/287 |
| 2011/0180858 A1 * | 7/2011 | Chiang | H01L 29/7803 257/262 |
| 2013/0181280 A1 | 7/2013 | Sdrulla et al. | |
| 2013/0256698 A1 * | 10/2013 | Sdrulla | H01L 29/7802 257/77 |

FOREIGN PATENT DOCUMENTS

| | | |
|---|---|---|
| CN | 103872137 A | 6/2014 |
| CN | 103928464 A | 7/2014 |
| CN | 105679820 A | 6/2016 |
| DE | 102006045312 B3 | 5/2008 |
| EP | 1058303 A1 | 12/2000 |
| JP | 2000252475 A | 9/2000 |

OTHER PUBLICATIONS

Search Report dated Feb. 11, 2020 issued in corresponding European Patent Application No. 17845275.1 (10 pages).

Office Action dated Mar. 3, 2020 issued in corresponding Japanese Patent Application No. 2019-511877 (6 pages).

* cited by examiner

DEVICE INTEGRATED WITH DEPLETION-MODE JUNCTION FIELF-EFFECT TRANSISTOR AND METHOD FOR MANUFACTURING THE SAME

CROSS REFERENCE TO RELATED APPLICATIONS

This application is a National Phase filing under 35 U.S.C. § 371 of PCT/CN2017/098314 filed on Aug. 21, 2017, and claims priority to Chinese Patent Application No. CN 201610793855.3, entitled "COMPONENT INTEGRATED WITH DEPLETION-MODE JUNCTION FIELD-EFFECT TRANSISTOR AND METHOD FOR MANUFACTURING COMPONENT" filed on Aug. 31, 2016. The entire contents of each application are hereby incorporated by reference.

TECHNICAL FIELD

The present disclosure relates to a semiconductor manufacturing technique, and more particularly to a device integrated with a depletion-mode junction field-effect transistor and a method for manufacturing a device integrated with a depletion-mode junction field-effect transistor.

BACKGROUND

At present, integrating a high-voltage Junction Field-Effect Transistor (JFET) on a high-voltage process platform is an advanced development and conception in the field of smart power integrated circuits, which can greatly improve the on-state performance of longitudinal power devices and significantly reduce the chip area, and is in line with the mainstream trend of manufacturing a smart power device nowadays.

The high-voltage integrated JFET of the conventional structure can be implemented by a simpler technology. However, the instability and poor regulation of the pinch-off voltage limit its large-scale application in the field of smart power integration.

SUMMARY

A device integrated with a depletion-mode junction field-effect transistor and a method for manufacturing the device are provided according to each of embodiments of the present disclosure.

A device integrated with a depletion-mode junction field-effect transistor is provided, the device is divided into a Junction Field-Effect Transistor (JFET) region and a power device region, and the device comprises: a first conduction type drain, while a portion of the drain is configured to form the JFET region, and the other portion of the drain is configured to form the power device region; and a first conduction type region located on a surface of the first conduction type drain facing a front face of the device, and a portion of the first conduction type region is configured to form the JFET region, and the other portion of the first conduction type region is configured to form the power device region; the JFET region comprises: a second conduction type well region formed within the first conduction type region, while the first conduction type is opposite to a second conduction type; at least two JFET sources having a first conduction type, which is formed within the second conduction type well region; a metal electrode of the JFET source formed on the JFET source, which is in contact with the JFET source; a lateral channel region being of the first conduction type, which is formed between two adjacent JFET sources, while two ends of the lateral channel region are in contact with the two adjacent JFET sources; and a JFET metal gate formed on the second conduction type well region.

A method for manufacturing a device integrated with a depletion-mode junction field-effect transistor is provided, the device comprising a Junction Field-Effect Transistor (JFET) region and a power device region, the method comprising: providing a substrate of a first conduction type on which a first conduction type region is formed, while the first conduction type is opposite to a second conduction type; implanting ions of the second conduction type into the first conduction type region and forming a first well within the first conduction type region by driving-in; growing a field oxide layer and a gate oxide layer on a surface of the device in sequence, and forming a polysilicon layer on the surface of the first conduction type region; implanting ions of the first conduction type, to form at least two JFET sources in the JFET region, and form a power device source in the power device region; photoetching and etching to remove polysilicon and other surface medium above a position between two adjacent JFET sources, for forming a channel implantation window, and implanting ions of the first conduction type into the channel implantation window, for forming a lateral channel region; and photoetching and etching a contact holes, depositing a metal layer, filling the metal layer into the contact hole, to form a metal electrode of the JFET source, a JFET metal gate and a metal contact of the power device source respectively.

For the above-mentioned device integrated with the depletion-mode junction field-effect transistor and the method for manufacturing the device, the lateral channel region is an N-channel formed between two adjacent JFET sources and two ends of the lateral channel region are in contact with the two JFET sources, so that the channel concentration is more uniform, and a longer lateral channel is designed by layout, and the pinch-off voltage thereof may be more stable. Meanwhile, since the lateral channel concentration is more uniform, the pinch-off voltage thereof is also more stable.

BRIEF DESCRIPTION OF DRAWINGS

In order to make the technical solutions in embodiments of the present disclosure or prior art more clearly, drawings needed in illustration of embodiments will be briefly introduced as follows. Apparently, the following described drawings are only some embodiments of the present disclosure, and it is possible for those skilled in the art to obtain drawings of other embodiments according to these drawings without any creative work.

DETAILED DESCRIPTION OF DISCLOSED EMBODIMENTS

Figure 1:
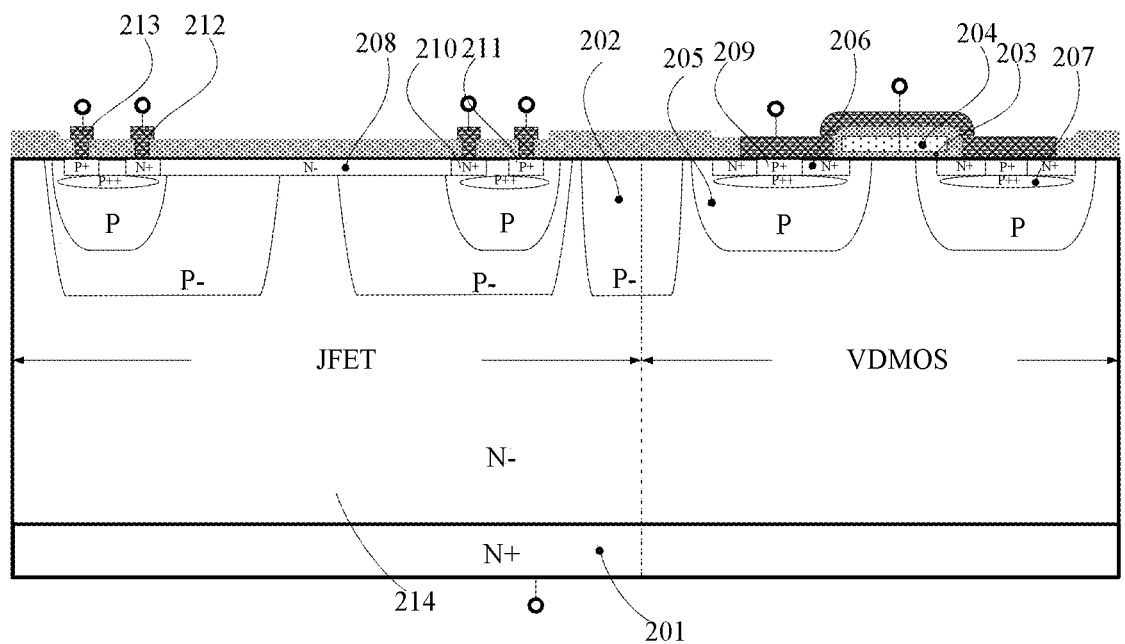
FIG. 1 is a sectional schematic diagram of a device integrated with a depletion-mode junction field-effect transistor according to an embodiment of the present disclosure.

In order to facilitate the understanding of the present disclosure, the present disclosure will be detailed hereinafter with reference to the accompanying drawings. Preferred embodiments of the disclosure are given in the drawings. However, the disclosure may be implemented in many different forms and is not limited to the embodiments described herein. On the contrary, the purpose of providing these embodiments is to make the disclosure more thorough and comprehensive.

Unless otherwise defined, all technical and scientific terms used herein have the same meaning as commonly understood by those skilled in the art belonging to the technical field of the disclosure. The terms used in the description of the present disclosure are for the purpose of describing specific embodiments and is not intended to limit the disclosure. The term "and/or" used herein includes any and all combinations of one or more of the associated listed items.

It should be noted that when an element is referred to as being "fixed" to another element, the element can be directly on the other element or there may be a mediate element. When an element is referred to as "connected" to another element, the element can be directly connected to the other element or there may be a mediate element simultaneously. The terms "vertical", "horizontal", "upper", "lower", "left", "right" and the like, as used herein, are used for purpose of illustration only.

The vocabulary of the semiconductor field used herein is a technical vocabulary commonly used by those skilled in the art, for example, for P type and N type impurities, in order to distinguish the doping concentration, simply, P+ type is taken to represent a P type of heavy doping concentration, P type is taken to represent P type of moderate doping concentration, P− type is taken to represent P type of mild doping concentration, N+ type is taken to represent N type of heavy doping concentration, N type is taken to represent N type of moderate doping concentration, and N− type is taken to represent N type of mild doping concentration.

FIG. 1 is a sectional schematic diagram of a device integrated with a depletion-mode junction field-effect transistor according to an embodiment. In this embodiment, an N type is defined as a first conduction type, a P type is a second conduction type, and a power device is a Vertical Double-diffused Metal Oxide Semiconductor Field-Effect Transistor (VDMOS). As shown in FIG. 1, the device is divided into a JFET region and a VDMOS region according to structure. A portion of an N+ type drain 201 located on the back face of the device (i.e., the surface facing downward in FIG. 1) is configured to form the JFET region and the other portion thereof is configured to form the VDMOS region. Similarly, a portion of an N− type region 214 located on the front face of the drain 201 (i.e., the surface facing upward in FIG. 1) is configured to form the JFET region and the other portion thereof is configured to form the VDMOS region. In the present embodiment, the drain 201 is an N+ drain, and the N type region 214 is an N− epitaxial layer. In other embodiments, it is also possible to directly use the N type substrate as the N type region 214.

In the embodiment, the JFET region includes a lateral channel region 208, a JFET source 210, a metal electrode 212 of the JFET source, a JFET metal gate 213 and a well region.

The N+ JFET source 210 is formed in the well region, and the lateral channel region 208 is an N− channel formed between two adjacent JFET sources 210 and two ends of the lateral channel region 208 are in contact with the two JFET sources 210. A metal electrode 212 of the JFET source is formed on the JFET source 210, as a source contact of the JFET source 210. The JFET metal gate 213 is formed on the well region.

For the above-mentioned device integrated with the depletion-mode junction field-effect transistor, the lateral channel region is an N− channel formed between two adjacent JFET sources and two ends of the lateral channel region are in contact with the two JFET sources, so that the channel concentration is more uniform, and a longer lateral channel is designed by layout, and the pinch-off voltage thereof may be more stable. Meanwhile, since the lateral channel concentration is more uniform, the pinch-off voltage is also more stable.

In the embodiment as shown in FIG. 1, a well region is a composite well region structure composed of a first well 202 and a second well 205. The composite well region structure is formed within the N− epitaxial layer. The first well 202 is a P− well and the second well 205 is a high voltage P well located within the first well 202. The ion concentration of the second well 205 is greater than that of the first well 202. Within one cell, each composite well region structure is formed at each of both ends of the lateral channel region 208. The lateral channel region 208 of the JFET region is pinched off by depletion of the second well 205 and the first well 202, and the second well 205 will suffer the reverse voltage when the device is turned off.

Compared with a single P− well, the composite well region has a larger ion concentration, which prevents depletion and punch through of the PN junction caused by adding a high voltage on the drain. It can be understandable that in other embodiments, the well region may also employ a single P well or P− well structure.

In the embodiment as shown in FIG. 1, the lateral channel region 208 extends into the second well 205 of the composite well region structure, and the JFET source 210 is formed within the second well 205 of the composite well region structure. It can be understandable that in other embodiments, the two ends of the lateral channel region 208 may also be in some distance away from the second well 205 of the composite well region structure, or the JFET source 210 may be located outside the second well 205 of the composite well region structure within the first well 202 of the composite well region structure.

In the embodiment as shown in FIG. 1, a first well 202 is formed at the boundary between the JFET region and the VDMOS region, as isolation of the JFET region and the VDMOS region. The P− first well 202 is utilized to assist depletion and form isolation. The flow path of the current can be completely blocked by the deeper P− well isolation, thereby preventing electric leakage between the JFET and the VDMOS, and being capable of assisting the lower N− epitaxial layer, i.e., N type region 214, to participate in the depletion when the device is biased reversely and can withstand voltage, and boosting the breakdown voltage of the local region to serve for solidifying the breakdown point. At the same time, the first well 202, serving as a depletion structure of a terminal in the junction terminal extension technique, can effectively shorten the chip area of the high voltage VDMOS. In addition, due to the presence of the junction process of the junction terminal extension technique, the junction depth of the P− well greatly exceeds the junction depth of the P type substrate of the VDMOS in the conventional technique, thus a longer longitudinal current channel forms. Compared with the conventional structure, the stability of the pinch-off voltage of the device is improved more, meanwhile the pinch-off voltage is also significantly reduced.

In the embodiment as shown in FIG. 1, the JFET region further includes a JFET gate ohmic contact 211 of the P type. One JFET gate ohmic contact 211 is formed in each of two second wells 205 at both sides of the lateral channel region 208, and is located on one side of the JFET source 210 away from the lateral channel region 208. The JFET metal gate 213 is formed on the JFET gate ohmic contact 211 and in contact with the JFET gate ohmic contact 211. In the embodiment, the ion concentration of the JFET gate ohmic contact 211 is greater than that of the second well 205.

In the embodiment as shown in FIG. 1, the VDMOS region includes a gate (the gate includes a gate oxide layer 203 and a polysilicon gate 204), a second well 205, an N+ VDMOS source 206 located within the second well 205, and an Unclamped Inductive Switching (UIS) region 207 of the P type located under the VDMOS source 206. The ion concentration of the UIS region 207 is greater than that of the second well 205. In the embodiment as shown in FIG. 1, a UIS region 207 is also formed within the JFET region, which is specifically located under the JFET source 210, and in the present embodiment is located within the second well 205 of the JFET region, and in other embodiments, may be located outside the second well 205 of the JFET region within the first well 202.

In the embodiment as shown in FIG. 1, each second well 205 is formed on each side under the gate, the VDMOS source 206 is formed within the two second wells 205, and the VDMOS source 206 is divided into two blocks in each of the two second wells 205. The device further includes an ohmic contact region 209 of the P type formed between the two blocks of the VDMOS sources 206.

Figure 2:
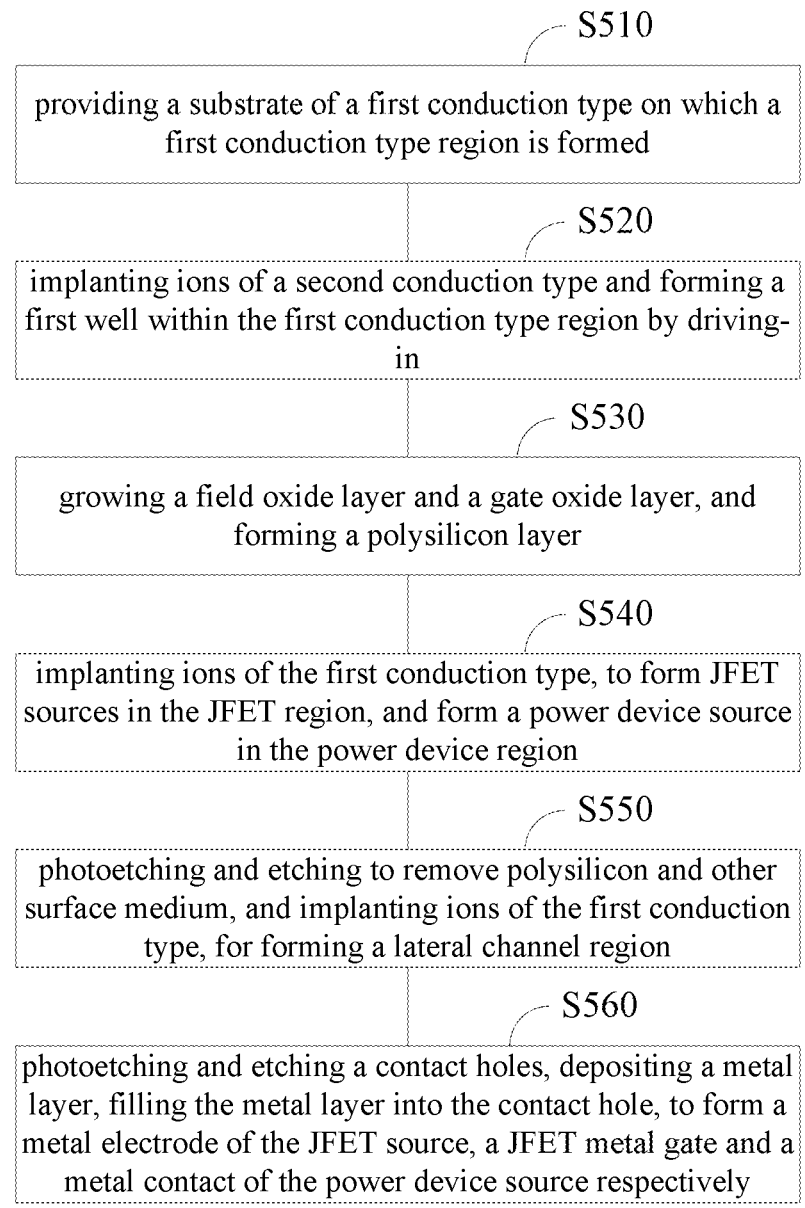
FIG. 2 is a flow chart showing a method for manufacturing a device integrated with a depletion-mode junction field-effect transistor according to an embodiment of the present disclosure.

FIG. 2 is a flow chart showing a method for manufacturing a device integrated with a depletion-mode junction field-effect transistor according to an embodiment. As below, the device is a VDMOS, the first conduction type is the N type, and the second conduction type is the P type. A method for manufacturing a device integrated with a depletion-mode junction field-effect transistor is introduced as follows.

At step S510, a substrate of a first conduction type is provided, while a first conduction type region is formed on the substrate.

In this embodiment, an N type region 214 is epitaxially formed on the N+ substrate, and the substrate will subsequently serve as a drain 201 of the device.

At step S520, ions of the second conduction type are implanted and a first well is formed in the first conduction type region by driving-in.

Figure 3A:
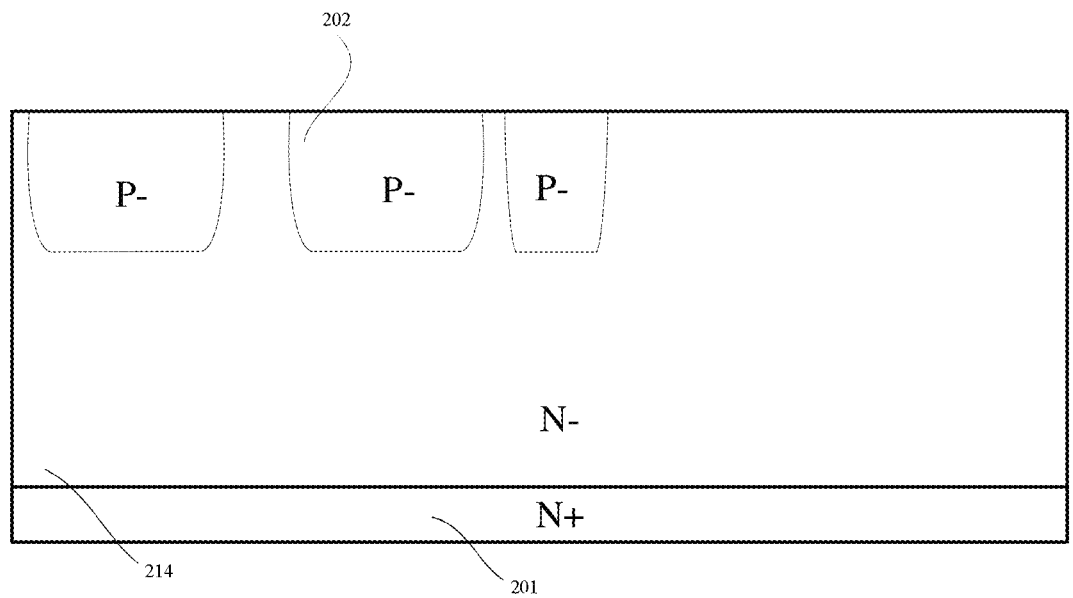
FIGS. 3a-3d are sectional schematic diagrams of the device in the manufacturing process of the manufacturing method as shown in FIG. 2.

In the embodiment, P type ions are implanted into the N type region 214 and the first well 202 is formed within the N type region 214 by driving-in. FIG. 3a is a sectional schematic diagram of the device after the step S520 is completed.

At step S530, a field oxide layer and a gate oxide layer are grown, and a polysilicon layer is formed.

Figure 3B:
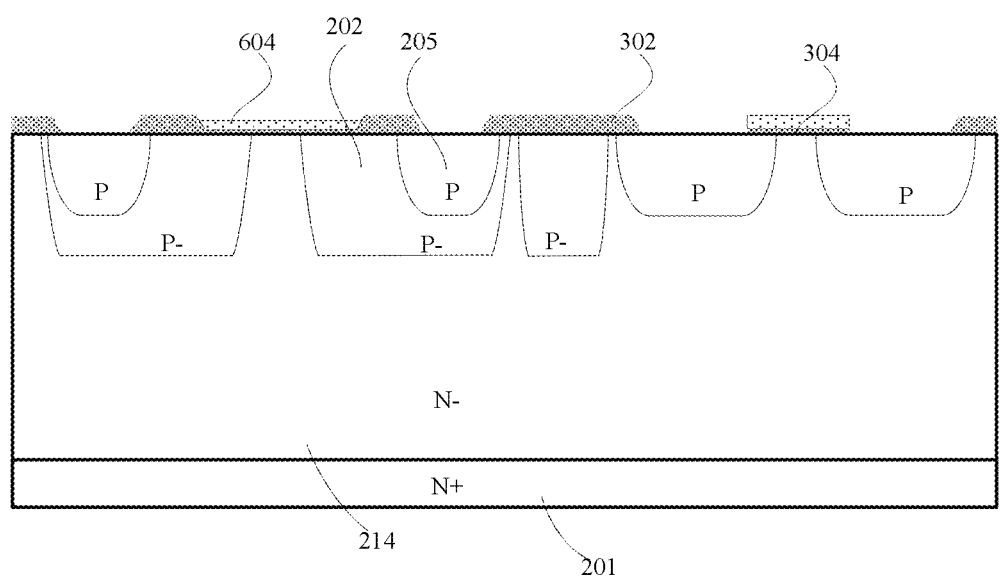

A thick field oxide layer 302 is grown on the surface of the device and then a gate oxide layer 304 is grown, and a polysilicon layer 604 is formed on the surface of the N type region 214. In the embodiment, the well region of the JFET region is a composite well region structure composed of the first well 202 and the second well 205. Therefore, P type ions are implanted into the N type region 214 by serving the field oxide layer and the polysilicon layer 604 as a mask, and a plurality of second wells 205 are formed by driving-in. Each of the second wells 205 of the JFET region is formed within one first well 202. The ion concentration of the second well 205 is greater than that of the first well 202. FIG. 3b is a sectional schematic diagram of the device after the step S530 is completed.

At step S540, ions of a first conduction type implanted, a JFET source in the JFET region is formed, and a power device source is formed in the power device region.

In the embodiment, a photoetching technology is utilized to implant N type ions with a photoresist as a mask, a JFET source is formed within a second well 205 of the JFET region, and a VDMOS source 206 is formed in the second well 205 of the power device region. The VDMOS source 206 is formed in each of the second wells 205 at both sides of the gate, and is divided into two blocks in each of the second wells 205, leaving a position in the middle for the ohmic contact region 209 formed in the subsequent step.

Figure 3C:
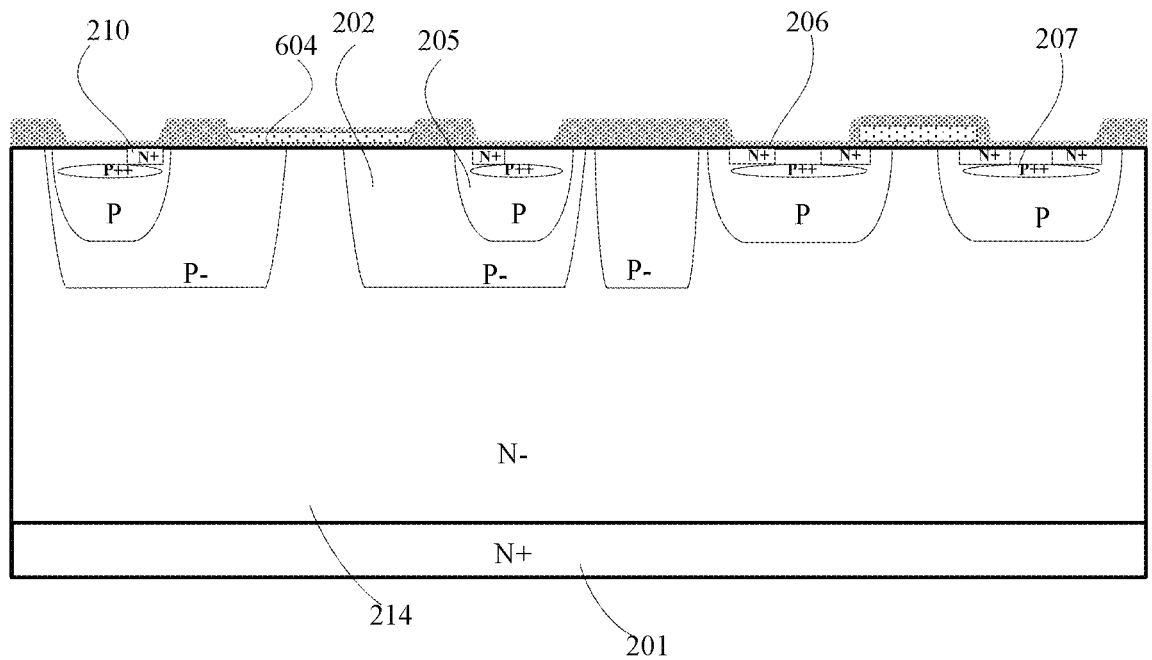

Referring to FIG. 3c, in the embodiment, prior to performing the step S550, the method further includes a step of implanting P type ions into the second well 205, to form an Unclamped Inductive Switching (UIS) region 207 under the VDMOS source 206 within the second well 205. In the embodiment, in order to prevent the P type ions implanted into the second well 205 from adversely affecting the channel region, prior to the step of implanting the P type ions to form the UIS region 207, the method further includes a step of forming an implantation barrier layer. In the embodiment, the forming an implantation barrier layer is performed by re-forming one oxide layer. Since the oxide layer at the implantation window, through which the P type ions are implanted to form the UIS region 207, is thinner, the high-energy implanted P type ions can pass through the oxide layer to form the UIS region 207. The oxide layer at other location is formed on the structure such as the field oxide layer, the polysilicon layer 604, etc., as a result, the thickness of the entire implantation barrier layer is thicker, and it is difficult for the P type ions to pass through the implantation barrier layer into the N type region 214.

At step S550, the polysilicon and other surface medium on the surface are removed by photoetching and etching, ions of the first conduction type are implanted, and a lateral channel region is formed.

Figure 3D:
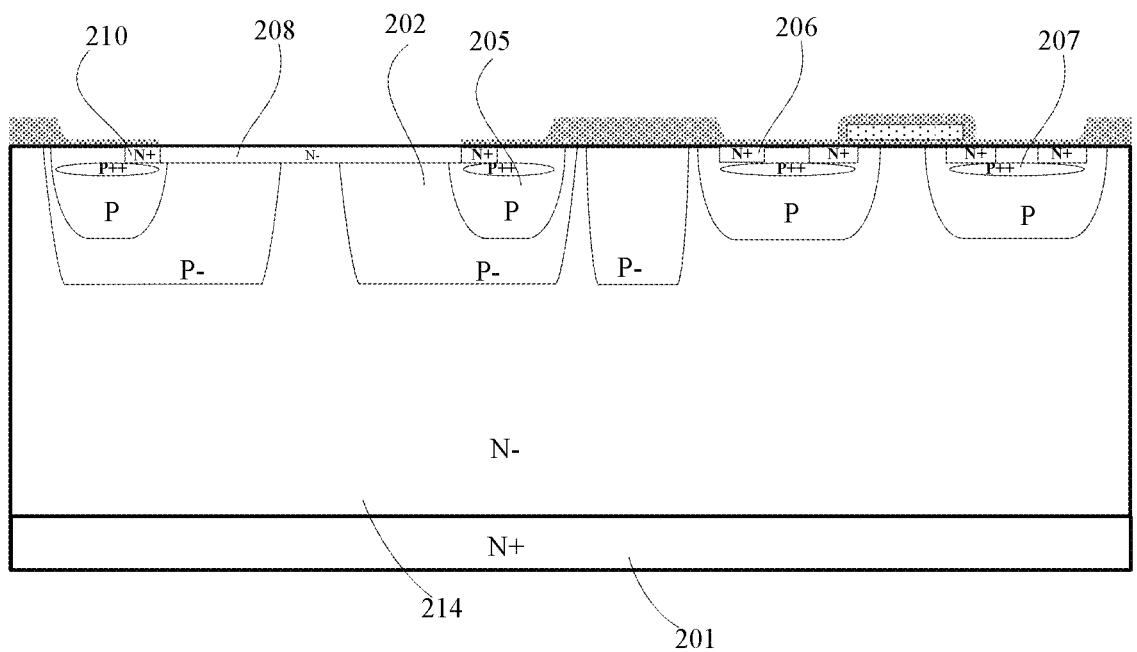

In the embodiment, the medium (for example, the field oxide layer, the implantation barrier layer) and the polysilicon layer 604 above the position between the two adjacent JFET sources 210 are removed by photoetching and etching, and then the N type impurity is implanted, and a lateral channel region 208 is formed between the two adjacent JFET sources 210 on the surface of the N type region 214. The redundant polysilicon layer 604 is removed to form the polysilicon gate 204 as shown in FIG. 1. FIG. 3d is a sectional schematic diagram of the device after the step S550 is completed.

At step S560, a contact hole is photoetched and etched, a metal layer is deposited, and the metal layer is filled into the contact hole to form a metal electrode of the JFET source and a JFET metal gate.

In the embodiment, after etching the contact hole, the method further includes a step of implanting P type ions into the contact hole, and forming a JFET gate ohmic contact 211 within the second well 205 of the JFET region, and an ohmic contact region 209 within the second well 205 of the power device region respectively. The metal filled into the contact hole is in contact with the JFET gate ohmic contact 211 to form the JFET metal gate 213, and the metal filled into the contact hole is in contact with the JFET source 210 to form the metal electrode 212 of the JFET source. A passivation layer is formed on the surface of the device after depositing the metal layer, and the section of the completed device is shown in FIG. 1.

Combining the above advantages, the above-mentioned device integrated with depletion-mode junction field-effect transistor improves the stability of the pinch-off voltage on the basis of the conventional technique, solidifies the breakdown point, strengthens the UIS capability, perfectly matches the technology, and realizes the adjustability of the pinch-off voltage.

In one of the embodiments, the step S520 includes forming a first well 202 at the boundary between the JFET region and the power device region, as isolation of the JFET region and the power device region.

In one of the embodiments, the implantation concentration of the first well 202 of the step S520 is from 1.5E13 $cm^{-2}$ to 2.2E13 $cm^{-2}$, and the well depth of the first well 202 is from 8.5 micrometers to 13.5 micrometers.

In one of the embodiments, for a device with the pinch-off voltage in a range of 5V to 15V, the N type ions implanted in the step S550 are made of As (arsenic) or P (phosphorus). For the arsenic ions, the implantation energy is from 100 keV to 180 keV, and the implantation dose is from 2e12 $cm^{-2}$ to 7e12 cm-2. For the phosphorus ions, the implantation energy is from 60 keV to 120 kev, and the implantation dose is from 2e12 $cm^{-2}$ to 7e12 $cm^{-2}$.

The above-mentioned embodiments are merely illustrative of several embodiments of the present disclosure, and the description thereof is more specific and detailed, but is not understood as limiting the scope of the disclosure. It should be noted that a number of variations and modifications may be made by those skilled in the art without departing from the spirit of the disclosure, and these variations and modifications also belong to the scope of the disclosure. Therefore, the scope of the disclosure should be subject to the appended claims.

What is claimed is:

1. A device integrated with a depletion-mode junction field-effect transistor, the device is divided into a Junction Field-Effect Transistor (JFET) region and a power device region, the device comprising:
    a first conduction type drain, while a portion of the drain is configured to form the JFET region, and the other portion of the drain is configured to form the power device region; and
    a first conduction type region located on a surface of the first conduction type drain facing a front face of the device, while a portion of the first conduction type region is configured to form the JFET region, and the other portion of the first conduction type region is configured to form the power device region; the JFET region comprising:
    at least two second conduction type well regions formed within the first conduction type region, while the first conduction type is opposite to a second conduction type;
    at least two JFET sources having a first conduction type, which are formed within the at least two second conduction type well regions respectively;
    a metal electrode of a JFET source formed on the JFET source, which is in contact with the JFET source;
    a lateral channel region being of the first conduction type, which is formed between two adjacent JFET sources, while two ends of the lateral channel region are in contact with the two adjacent JFET sources; and
    a JFET metal gate formed on a second conduction type well region;
    wherein the second conduction type well region comprises a first well and a second well located within the first well, while an ion concentration of the second well is greater than that of the first well;
    the first well is located at a boundary between the JFET region and the power device region, to isolate the JFET region from the power device region.

2. The device according to claim 1, wherein the JFET region further comprises at least two JFET gate ohmic contacts, while each of the JFET gate ohmic contacts is formed within each of second conduction type well regions where the two adjacent JFET sources are located, and is located on one side of the JFET source away from the lateral channel region, and has the second conduction type; the JFET metal gate is formed on the JFET gate ohmic contact and in contact with the JFET gate ohmic contact.

3. The device according to claim 1, wherein the power device is a Vertical Double-diffused Metal-Oxide-Semiconductor Field-Effect Transistor (VDMOS).

4. The device according to claim 3, wherein the power device region comprises:
    a gate;
    a second well;
    a VDMOS first conduction type source located within the second well; and
    a first unclamped inductive switching region located within the second well and under the VDMOS first conduction type source, which has the second conduction type and an ion concentration greater than that of the second well.

5. The device according to claim 4, further comprising a second unclamped inductive switching region located under the JFET source and within the second well, which has the second conduction type and an ion concentration greater than that of the second well.

6. The device according to claim 4, wherein two second wells are located at both sides under the gate respectively, the VDMOS first conduction type source is formed within the two second wells, and the VDMOS first conduction type source is divided into two blocks in each of the two second wells.

7. The device according to claim 6, wherein further comprises a second conduction type ohmic contact region formed between the two blocks of the VDMOS first conduction type source.

8. The device according to claim 1, wherein the first conduction type is an N type, the second conduction type is a P type, and the first conduction type region is an N type epitaxial layer.

9. A method for manufacturing a device integrated with a depletion-mode junction field-effect transistor, the device comprising a Junction Field-Effect Transistor (JFET) region and a power device region, the method comprising:
    providing a substrate of a first conduction type on which a first conduction type region is formed; while the first conduction type is opposite to a second conduction type;
    implanting ions of a second conduction type into the first conduction type region and forming a plurality of first wells within the first conduction type region by driving-in;
    growing a field oxide layer and a gate oxide layer on a surface of the first conduction type region in sequence, and forming a polysilicon layer on the surface of the first conduction type region;

implanting ions of the first conduction type, to form at least two JFET sources in the JFET region, and form a power device source in the power device region;

photoetching and etching to remove polysilicon and other surface medium above a position between two adjacent JFET sources, for forming a channel implantation window, and implanting ions of the first conduction type into the channel implantation window, for forming a lateral channel region; and photoetching and etching a contact holes, depositing a metal layer, filling the metal layer into the contact hole, to form a metal electrode of the JFET source, a JFET metal gate and a metal contact of the power device source respectively;

wherein the forming the plurality of first wells within the first conduction type region comprises: forming a first well at a boundary between the JFET region and the power device region, as isolation of the JFET region and the power device region;

after the forming the polysilicon layer on the surface of the first conductive type region, the method further comprising: implanting ions of the second conduction type into the first conductive type region and forming a plurality of second wells by driving-in, while the second wells located within the JFET region are respectively formed within different first wells; and an ion concentration of the each second well is greater than that of the each first well.

10. The method according to claim 9, wherein the step of forming the JFET sources in the JFET region and forming the power device source in the power device region is: implanting ions of the first conduction type into the second wells to respectively form the JFET source in the JFET region and the power device source in the power device region.

11. The method according to claim 9, wherein after the step of forming the JFET sources in the JFET region and forming the power device source in the power device region, and prior to the step of photoetching and etching to remove the polysilicon and other surface medium above the position between the two adjacent JFET sources for forming the channel implantation window, further comprises: a step of implanting ions of the second conduction type into the second well of the power device region, to form an unclamped inductive switching region under the power device source and the JFET source within the second well, while an implantation energy is greater than that of the step of implanting ions of the first conduction type.

12. The method according to claim 11, wherein after the step of forming the JFET sources in the JFET region and forming the power device source in the power device region, and prior to the step of implanting ions of the second conduction type into the second well of the power device region, further comprises: a step of forming an implantation barrier layer.

13. The method according to claim 9, wherein the first conduction type is an N type, the second conduction type is a P type, the first conduction type region is an N type epitaxial layer, and the power device is a Vertical Double-diffused Metal-Oxide-Semiconductor Field-Effect Transistor (VDMOS).

14. The method according to claim 9, wherein in the step of implanting ions of the first conduction type into the channel implantation window, the implanted ions are arsenic ions, an implantation energy is from 100 keV to 180 keV, an implantation dose is from $2e12$ $cm^{-2}$ to $7e12$ $cm^{-2}$.

15. The method according to claim 9, wherein in the step of implanting ions of the first conduction type into the channel implantation window, the implanted ions are phosphorus ions, an implantation energy is from 60 keV to 120 keV, and an implantation dose is from $2e12$ $cm^2$ to $7e12$ $cm^2$.

* * * * *